(12) United States Patent
Karim et al.

(10) Patent No.: US 8,836,069 B2
(45) Date of Patent: Sep. 16, 2014

(54) METHOD AND APPARATUS FOR A LATERAL RADIATION DETECTOR

(76) Inventors: Karim S. Karim, Waterloo (CA); Kai Wang, Waterloo (CA); Amirhossein Goldan, Vancouver (CA)

( * ) Notice: Subject to any disclaimer, the term of this patent is extended or adjusted under 35 U.S.C. 154(b) by 109 days.

(21) Appl. No.: 13/265,907

(22) PCT Filed: Apr. 22, 2010

(86) PCT No.: PCT/CA2010/000641
§ 371 (c)(1), (2), (4) Date: Oct. 24, 2011

(87) PCT Pub. No.: WO2010/121386
PCT Pub. Date: Oct. 28, 2010

(65) Prior Publication Data
US 2012/0038013 A1 Feb. 16, 2012

Related U.S. Application Data

(60) Provisional application No. 61/202,962, filed on Apr. 23, 2009, provisional application No. 61/213,589, filed on Jun. 23, 2009.

(51) Int. Cl.
*H01L 27/146* (2006.01)
*H01L 31/0272* (2006.01)
*H01L 31/115* (2006.01)
*H01L 31/0224* (2006.01)
*H01L 31/107* (2006.01)
*H01L 31/108* (2006.01)

(52) U.S. Cl.
CPC .... *H01L 31/022408* (2013.01); *H01L 31/0272* (2013.01); *H01L 31/107* (2013.01); *H01L 31/115* (2013.01); *H01L 31/1085* (2013.01)
USPC .................................. 257/448; 257/E31.009

(58) Field of Classification Search
USPC ..................... 257/E31.066, E31.087, E31.86; 438/56–57, FOR. 136, FOR. 137
See application file for complete search history.

(56) References Cited

U.S. PATENT DOCUMENTS

| 5,117,114 A | 5/1992 | Street et al. |
| 5,780,916 A * | 7/1998 | Berger et al. ................ 257/471 |
| 6,069,360 A * | 5/2000 | Lund ....................... 250/370.01 |
| 6,080,997 A | 6/2000 | Tashiro et al. |
| 6,121,620 A | 9/2000 | Tashiro et al. |

(Continued)

OTHER PUBLICATIONS

Laih et al ((High responsivity a-Si:H bottom-electrode metal-semi-conductor-metal photodetector ( B M S M-PD), L.-H. Laih, Y.-A. Chen, W.-C. Tsay and J.-W. Hong, Electronics Letters May 9, 1996 vol. 32 No. 10).*

(Continued)

*Primary Examiner* — William F Kraig
*Assistant Examiner* — Khaja Ahmad
(74) *Attorney, Agent, or Firm* — Borden Ladner Gervais LLP; Jeffrey W. Wong

(57) ABSTRACT

A lateral Metal-Semiconductor-Metal (MSM) Photodetector (PD) is based on amorphous selenium (a-Se). It has low dark current, high photoconductive gain towards short wavelengths, and high speed of operation up to several KHz. From processing point of view, a lateral structure is more attractive due to ease of fabrication as well as compatibility with conventional thin-film transistor (TFT) processes. The lateral a-Se MSM PD therefore has potentials in a variety of optical sensing applications particularly in indirect X-ray imaging utilizing scintillators and ultraviolet (UV) imaging for life sciences.

8 Claims, 17 Drawing Sheets

(56) References Cited

U.S. PATENT DOCUMENTS

| | | | |
|---|---|---|---|
| 6,175,120 B1* | 1/2001 | McGregor et al. | 250/370.13 |
| 2003/0168604 A1 | 9/2003 | Nomura et al. | |
| 2004/0104365 A1* | 6/2004 | Imai | 250/591 |
| 2005/0145969 A1* | 7/2005 | Gulden et al. | 257/449 |
| 2005/0242292 A1* | 11/2005 | El-Hanany et al. | 250/374 |
| 2009/0001254 A1* | 1/2009 | Ogawa et al. | 250/208.1 |

OTHER PUBLICATIONS

Taghibakhsh et al., "Characterization of Short-Wavelength-Selective a-Si:H MSM Photoconductors for Large-Area Digital-Imaging Applications", IEEE Transactions on Electron Devices, vol. 55, issue 1, pp. 337-342, Jan. 2008.

Khodami et al, "UV-Enhanced a-Si:H Metal-Semiconductor-Metal Photodetector", IEEE Electron Device Letters, vol. 29, issue 9, pp. 1007-1010, Sep. 2008.

Canadian Intellectual Property Office as International Searching Authority, International Search Report and Written Opinion for International Patent App. No. PCT/CA2010/000641, Jul. 12, 2010.

Canadian Intellectual Property Office as International Searching Authority, International Preliminary Report on Patentability for International Patent App. No. PCT/CA2010/000641, Jul. 18, 2011.

* cited by examiner

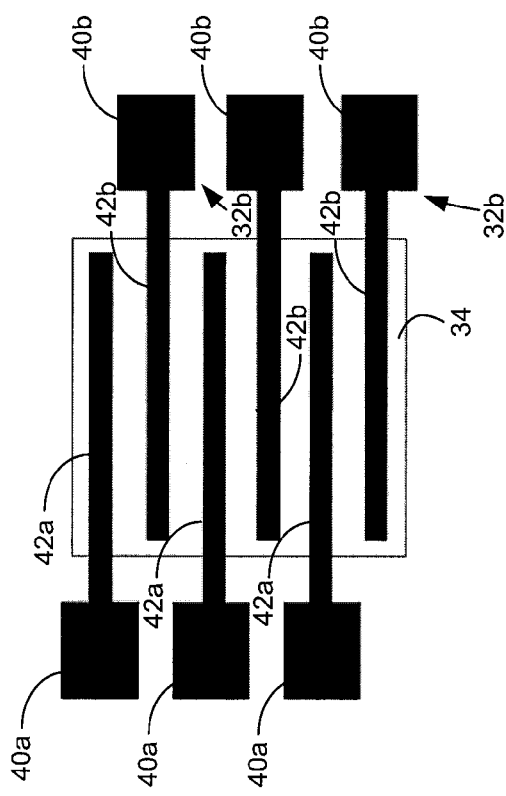
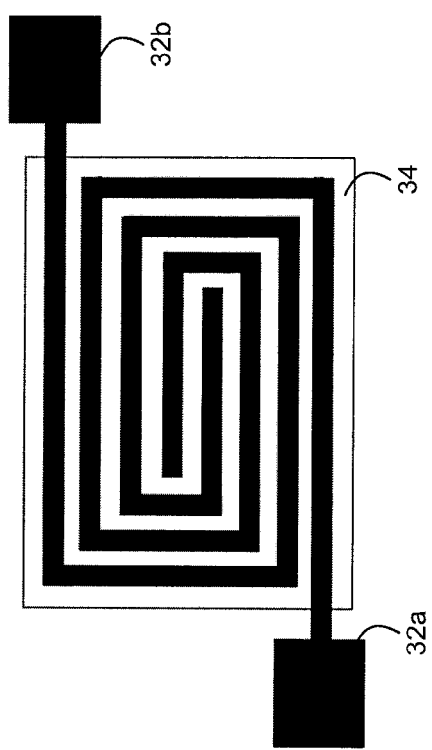
Figure 3b
Figure 3a

METHOD AND APPARATUS FOR A LATERAL RADIATION DETECTOR

CROSS-REFERENCE TO RELATED DOCUMENTS

This application claims the benefit of priority of U.S. Provisional Patent Application No. 61/202,962 filed Apr. 23, 2009, and U.S. Provisional Patent Application No. 61/213,589, filed Jun. 23, 2009, both of which are incorporated herein by reference in their entirety.

FIELD OF THE DISCLOSURE

The disclosure is directly generally to radiation detectors and more specifically to a method and apparatus for a lateral radiation detector.

BACKGROUND OF THE DISCLOSURE

In modern microelectronics, there are two main photodetector (PD) configurations, namely vertical photovoltaic type PDs such as p-type intrinsic n-type (PIN or PN) diodes and lateral photoconductive type PDs such as metal-semiconductor-metal (MSM) photoconductors.

In a photovoltaic-type detector, incident photons are absorbed in an active semiconductor layer sandwiched between two electrodes one of which should be transparent to the photons such as transparent conductive oxides. The photovoltaic-type detector works under the reverse bias conditions in which the created electric field sweeps the photogenerated carriers to form the photocurrent.

In a photoconductive-type detector, incident light is absorbed directly by the photoconductive layer and the photocurrent signal is obtained by applying an electric field across the photoconductive layer.

Generally, the photovoltaic-type detector has higher conversion efficiency and larger fill factor. However, the photoconductive-type detector is more advantageous in terms of integration simplicity, ease of fabrication, cost effectiveness and speed.

Typically, a lateral MSM PD includes Ohmic or Schottky contacts on a top or at a bottom of the semiconductor (e.g. amorphous silicon) layer which functions as a photoconductor instead of a diode. MSM PDs are biased such that one contact is forward biased and the other one is in the reverse bias. Upon light illumination, photons are absorbed by the semiconductor layer and free carriers are generated due to photoconductive effect and collected by the electric field across the semiconductor layer through biasing the contacts to leverage the potential energy of electrons in the conduction band and holes in the valence band and would then contribute to the photocurrent.

In terms of photosensing materials, amorphous silicon has been used in most current MSM PDs, however, the wavelength selectivity of such PDs is primarily governed by the thickness of the semiconductor layer. As a result, in current MSM PDs, the leakage current level still does not meet the stringent requirement for high-sensitive and low-noise indirect conversion X-ray imaging applications.

Therefore, there is provided a novel lateral radiation detector for using in a charge sensing system.

SUMMARY OF THE DISCLOSURE

The present disclosure is directed at a lateral photodetector (PD) which in the preferred embodiment is a metal-semiconductor-metal (MSM) PD with amorphous selenium (a-Se). The same type of design is also applicable to other materials including those used in X-ray imaging such as Mercury Iodide, lead oxide, Indium Phosphide, or the like.

In one aspect, there is provided a lateral radiation detector comprising a substrate layer; a semiconductor layer; and a set of at least two contacts, located between the semiconductor layer and the substrate layer, wherein the set of at least two contacts includes at least one anode and at least one cathode, the anode and the cathode spaced laterally away from each other.

In another aspect, there is provided a method of manufacturing a lateral radiation detector comprising depositing a conductive layer on a substrate layer; patterning a set of least two contacts from an uppermost conductive layer, the at least two contacts including an anode and a cathode, the anode and the cathode spaced laterally from each other; and depositing a semiconductor layer on top of the substrate layer.

BRIEF DESCRIPTION OF THE DRAWINGS

Embodiments of the present disclosure will now be described, by way of example only, with reference to the attached Figures, wherein:

FIG. 3a is a schematic diagram of a first embodiment of how electrodes can be set up in a lateral radiation detector;

FIG. 3b is a schematic diagram of a second embodiment of how electrodes can be set up in a lateral radiation detector;

FIGS. 4b to 4f are schematic diagrams illustrating the method of FIG. 4a;

FIGS. 5b to 5d are schematic diagrams illustrating the process of manufacturing the detector of FIG. 5a;

FIGS. 6b to 6f are schematic diagrams illustrating the process of manufacturing the detector of FIG. 6a;

FIGS. 7b to 7g are schematic diagrams illustrating the process of manufacturing the detector of FIG. 7a;

DETAILED DESCRIPTION

Figure 1:
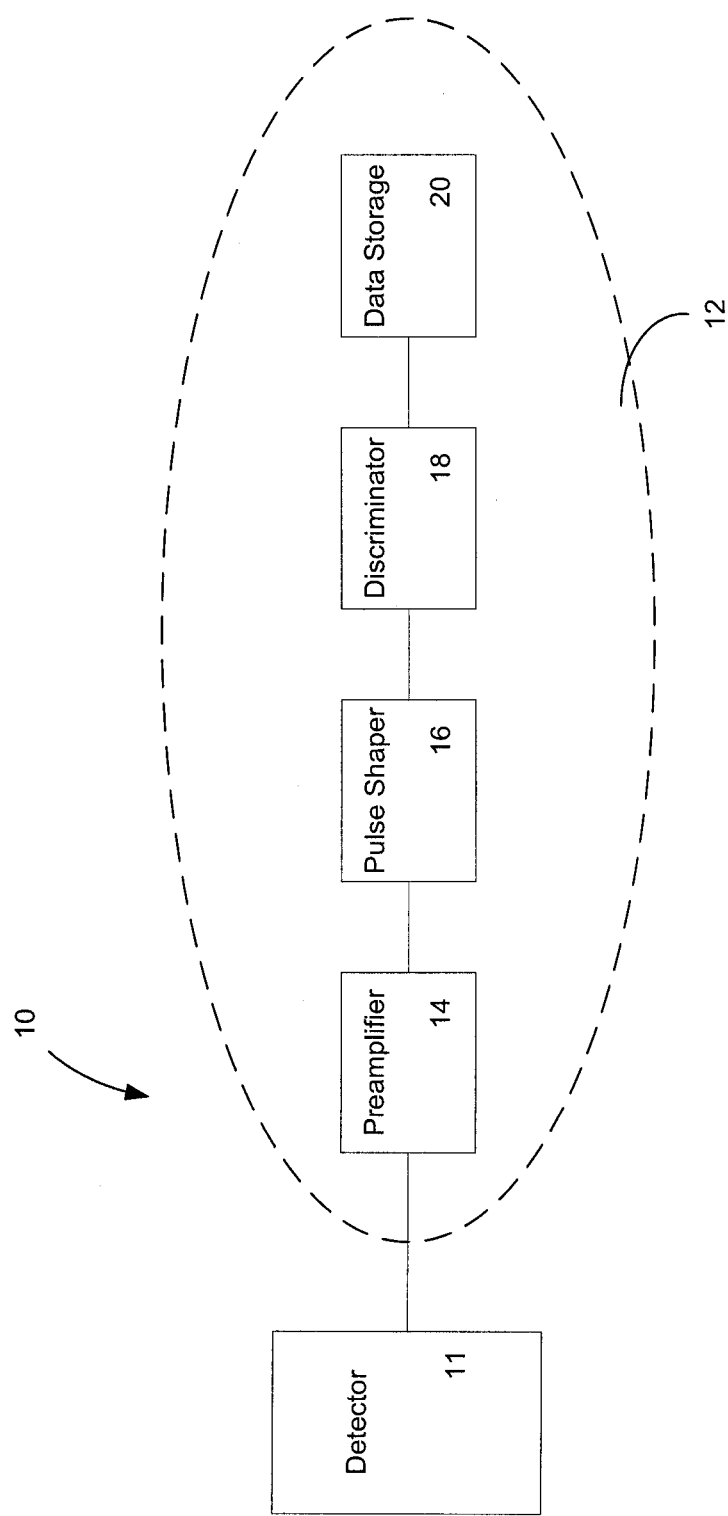
FIG. 1 is a schematic diagram of a system for charge sensing.

Turning to FIG. 1, an imager, or system for improving the resolution or performance of a semiconductor based radiation detector is shown. The system 10 includes a lateral radiation detector portion 11 which is connected to a readout portion 12. In the current embodiment, which is used for photon counting, the embodiment is implemented using complementary metal-oxide semiconductor (CMOS) technology such that the readout portion 12 includes a preamplifier 14, a pulse shaper 16, a discriminator 18 and data storage 20. Alternatively, polycrystalline silicon technology can also be used for the readout portion 12.

In an alternative embodiment, the readout portion 12 can also be used for integration, as the radiation detector improves on lag and potential ghosting. By masking out slow moving carriers, image lag can be reduced or eliminated thereby improving image quality and reducing the time necessary to acquire the image. A faster frame rate is also experienced which improves overall operation and enables 3D and real-time imaging The signal to noise ratio is also improved for both the photon counting and integration systems. In an integration system, the detector can be used in a passive pixel sensor (PPS) or an active pixel sensor (APS). Further operation of the readout portion 12 of the system will be well understood by one skilled in the art.

Figure 2A:
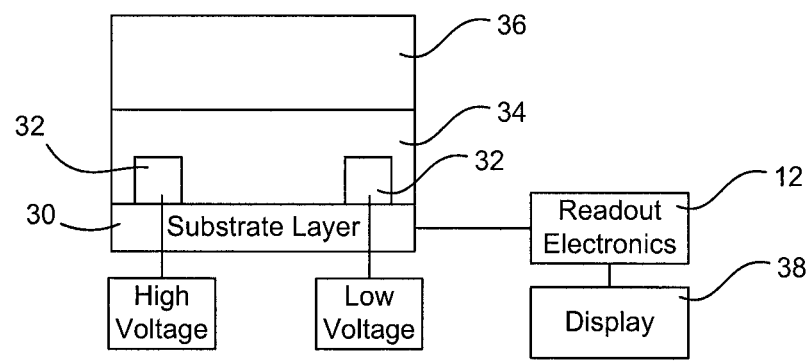
FIG. 2a is schematic diagram of a first embodiment of a radiation detector.

Turning to FIG. 2a, a more detailed schematic view of a first embodiment of the radiation detector 11 is shown. In the current embodiment, the radiation detector 11 is a photoconductive-type photodetector (PD) or a lateral PD. The radiation detector 11 includes a substrate layer 30 such as a thin film transistor (TFT) array or a CMOS electron pixilated array. Other substrate layers are contemplated and will be understood by those skilled in the art.

Atop the substrate layer 30 are a set of contacts 32 made of a metal such as aluminum or the like. The contacts 32 can also be seen as electrodes with at least one of the contacts being a cathode and at least one of the contacts being an anode. In the current embodiment, the contacts 32 are located directly on top of the substrate layer 30 and are laterally spaced apart from each other. Although the set of contacts 32 are shown to be at extreme opposite ends from each other, the spacing between the contacts is determined by the applications for which the detector is designed. Between or encasing the set of contacts 32 is a layer of photoconductor material 34 such as amorphous selenium (a-Se). In order to allow for high energy photons (e.g. X-ray) to be transmitted into the detector, a phosphor layer 36 can be placed on top of the photoconductor layer 34. Signals which are received on the substrate can then be processed and transmitted to the readout electronics 12, which in turn, transmits signals to a display 38 so that a user can view the images which are captured by the detector 11. In a preferred embodiment, the radiation detector 11 of FIG. 2a is used with a top-gate staggered thin film transistor.

In operation, X-rays are transmitted through the phosphor layer towards the photoconductor layer. As will be understood, in the absence of the phosphor layer, the x-rays are transmitted directly into the photoconductor layer. As the voltages connected to the electrodes are activated, an electric field is created. As the x-rays travel within the photoconductor layer, positively and negatively charged carriers are generated and travel towards one of the electrodes 32. Negatively charged carriers collect at the electrode acting as the anode while positively charged carriers collect at the electrode acting as the cathode. Depending on which contact, or electrode is the collecting electrode, the collecting electrode transmits signals to the readout electronics for processing and then display on the display panel. In the current embodiment, a high voltage source 33a is connected to one of the electrodes 32 while a low voltage source 33b is connected to another of the electrodes 32. Alternatively, the voltages 33a and 33b can be connected to the other of the electrodes 32.

Figure 2B:
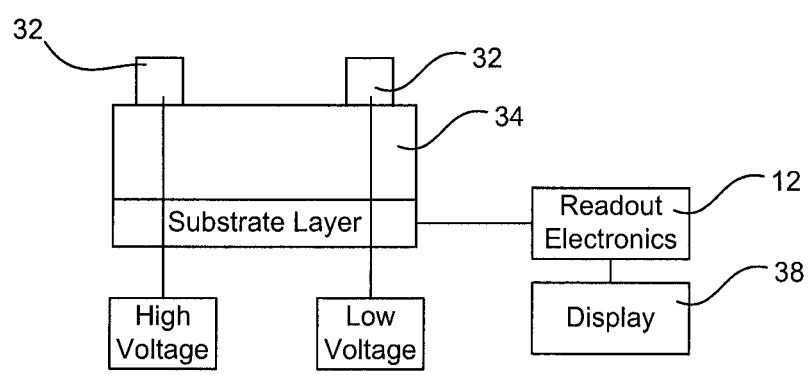
FIG. 2b is a schematic diagram of a second embodiment of a radiation detector.
Figure 2C:
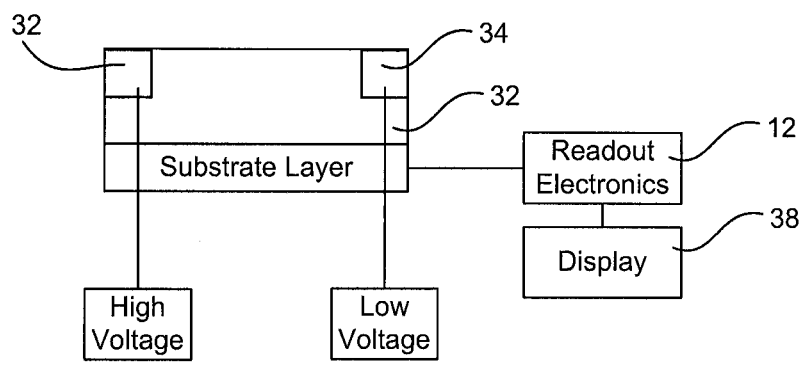
FIG. 2c is a schematic diagram of a third embodiment of a radiation detection system.
Figure 2D:
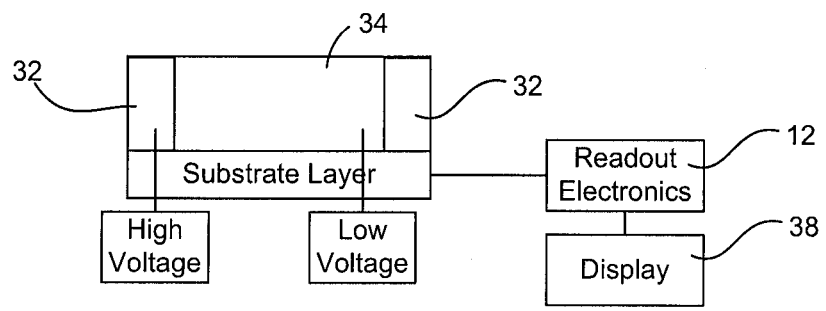
FIG. 2d is a schematic diagram of a fourth embodiment of a radiation detection system.

Turning to FIG. 2b, a schematic view of a second embodiment of a lateral radiation detector 11 is shown. In this embodiment, the detector 11 includes a substrate layer 30 which is connected to the readout electronics 12, which, in turn, are connected to the display 38. On top of the substrate layer 30 is a photoconductor layer 34 such as a-Se, with a set of contacts 32, laterally spaced from each other, located on top of the photoconductor layer 34. In operation, the radiation detector 11 of FIG. 2b is preferably used with a tri-layer bottom gate staggered thin film transistor. Alternatively, the set of contacts 32 can be located in a top portion of the photoconductor layer 34 (FIG. 2c) or adjacent the photoconductor layer 34 (FIG. 2d). The voltage sources 33a and 33b are connected to the electrodes 32 to provide the necessary electric field for in which the high energy photons travel.

In each embodiment, the contacts 32 are preferably implemented using a finger or spiral shape.

Figure 3C:
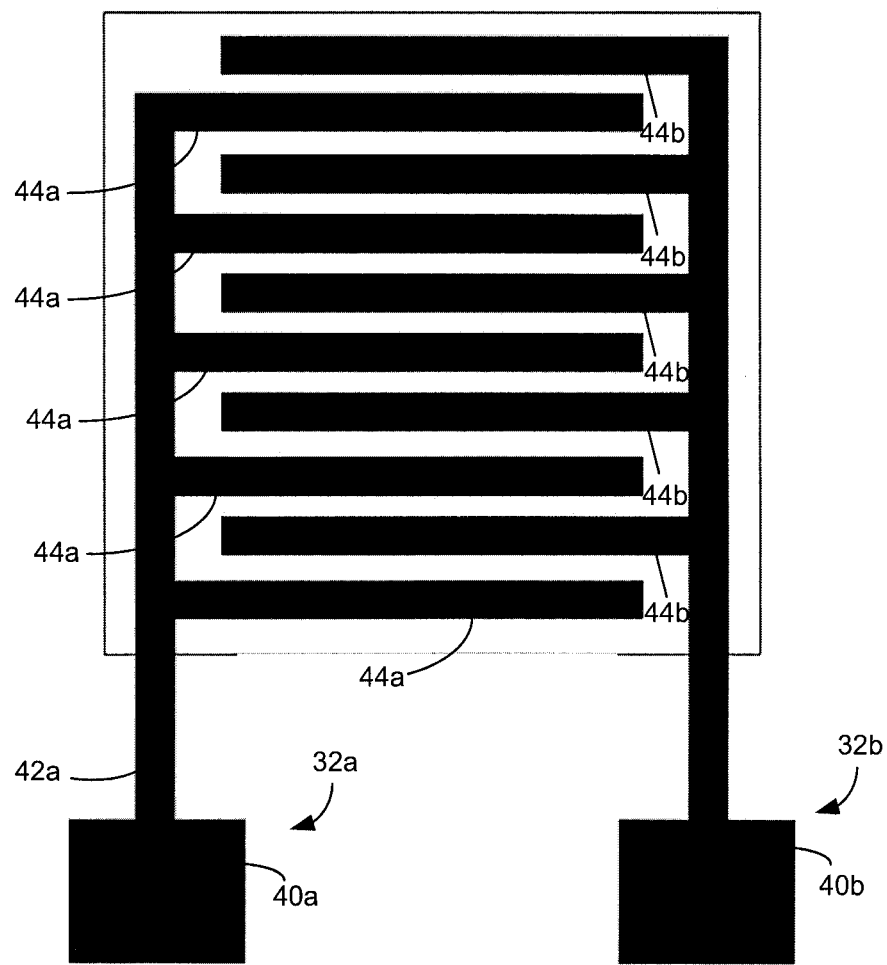
FIG. 3c is a schematic diagram of a third embodiment of how electrodes can be set up in a lateral radiation detector.

Turning to FIGS. 3a to 3c, various top views of how the contacts may be set up within the photoconductor layer are shown. In FIG. 3a, bases 40 of the contacts 32 are spaced apart from each other on either side of the photoconductor layer 34. Spiraling fingers 42 extend from each base 40 towards the middle of the photoconductor layer 34 and serve to collect the carriers depending on the voltage being supplied to the contact. As discussed above, one of the contacts 32a is seen as an anode while the other contact 32b is seen as a cathode. Therefore, if the carriers being collected are negatively charged, the collecting contact (or electrode) is the anode and the common electrode is the cathode. Alternatively, if the carriers being collected are positively charged, such as holes, the collecting electrode is the cathode and the common electrode is the anode.

Alternatively, as shown in FIG. 3b, the set of contacts 32 may include six contacts. Although shown as being evenly divided with three anodes 32a and three cathodes 32b, it will be understood that the contacts can be set up in other arrangements. In FIG. 3b, the set of anodes 32a include the base portion 40a with an individual finger 42a extending from each of the base portions 40a. Similarly, each of the set of cathodes 32b includes a base portion 40b with an individual finger 42b extending into the photoconductor layer 34.

In a further embodiment, as shown in FIG. 3c, the anode 32a includes the base portion 40a which has a finger 42a extending therefrom into the photoconductor layer 34. The finger 42a further comprises a set of offshoots, offsets or overlaps, or perpendicular portions 44a. Similarly, the cathode 32b includes the base portion 40b which has a finger 42b extending therefrom into the photoconductor layer 34. The finger 42b further comprises a set of offshoots or perpendicular portions 44b.

The benefit of a lateral PD with a-Se provides a photodetector which has an improved leakage current which means that the detector 11 is able to operate to sense a small amount of light. The lateral PD also uses less parts than a corresponding vertical PD which is geared towards an improved leakage current operation. Further advantages of the current disclosure include, but are not limited to, an improved dynamic range and also that the detector requires less power consumption in use.

Figure 4A:
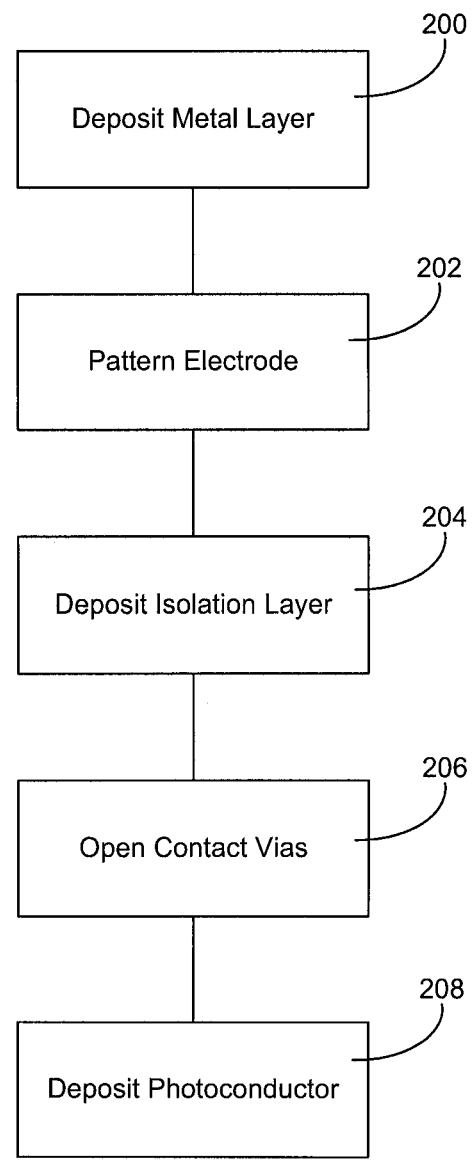
FIG. 4a is a flowchart outlining a method of manufacturing a radiation detector.

Turning to FIG. 4a, a flowchart outlining one method of manufacturing a lateral radiation detector is shown. FIGS. 4b to 4f are schematic representations of the method of FIG. 4a.

Figure 4B:
Figure 4C:
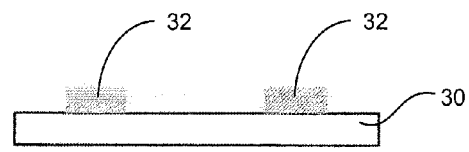
Figure 4D:
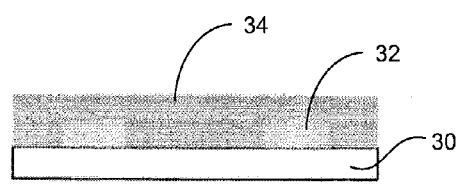
Figure 4E:
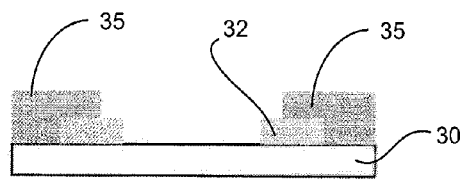
Figure 4F:
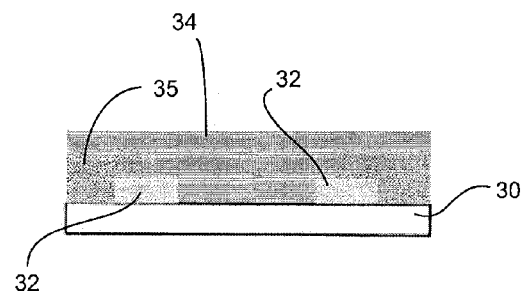

Assuming that a substrate layer is already provided as a foundation for the radiation detector, a metal layer is deposited 200 atop the substrate layer (FIG. 4b). After depositing the metal layer, the contacts (or electrodes) can then be patterned 202 using any known methods, including, but not limited to, photolithography, shadow masking, printing, and nanoimprinting (FIG. 4c). The electrodes are patterned such that they are located in the same plane with a lateral spacing therebetween so that a lateral radiation detector can be achieved. An isolation, or insulation, layer 35 is then deposited 204 over the contacts (FIG. 4d). It will be understood that the inclusion of the isolation layer is optional. In one embodiment, the isolation layer is a Silicon Nitride thin film, however, like materials can also be used. Contact vias can then be opened 206 (FIG. 4e). The inclusion of the isolation layer and the contact vias reduces the likelihood that the photoconductor can hamper operation of the contacts as a portion of the contacts are isolated from the photoconductor (or a-Se). The photoconductor layer can then be deposited 208 over the isolation layer and the contacts (FIG. 4f).

Figure 5A:
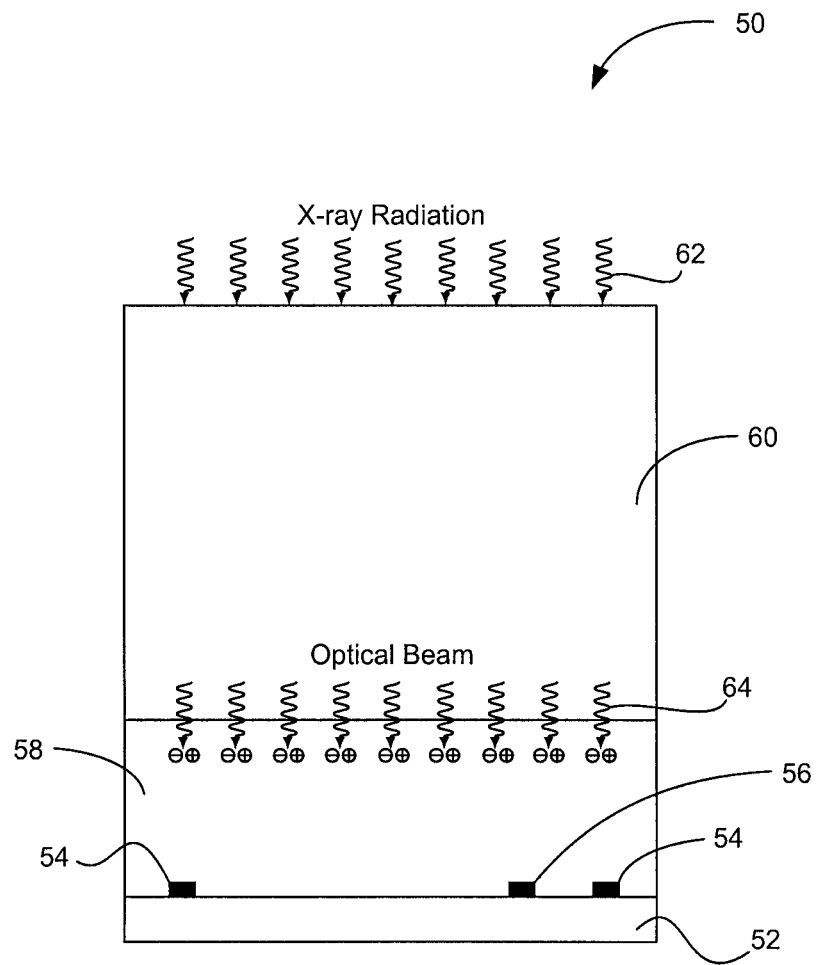
FIG. 5a is a schematic diagram of a lateral radiation detector with a coplanar Frisch grid.

Turning to FIG. 5a, another embodiment of a lateral radiation detector is shown. In the current embodiment, the lateral radiation detector includes a Frisch grid which may provide for a further embodiment of a lateral radiation detector 11. As shown, the detector 50 includes a substrate layer 52 and a set of contacts, or electrodes 54. In FIG. 5a, one of the contacts represents an anode while the other contact represents a cathode. A coplanar Frisch grid 56 is also located on the substrate. The detector 50 further includes a photoconductor, or semiconductor layer 58 such as a-Se or amorphous silicon. On top of the semiconductor layer is a phosphor layer 60, such as, but not limited to Sodium Iodide. In operation, X-ray radiation (as represented by arrows 62), travel within the phosphor layer results in optical beams (represented by arrows 64) travelling between the phosphor layer 58 and the semiconductor layer 56. The optical beams are absorbed and create the carriers which are then collected at their corresponding electrodes 54 in order for the image to be processed.

By including a Frisch grid, the final charge measurement is therefore less sensitive to the movement, trapping and detrapping of low-mobility carriers and therefore can decrease signal risetime and increase the operating speed.

In one embodiment, the Frisch grid is an additional electrode which can block charge induction from the slow-mobility carriers. Furthermore, the addition of the Frisch grid may also improve or produce avalanche-multiplication gain.

Figure 5B:
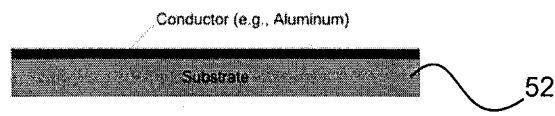
Figure 5C:
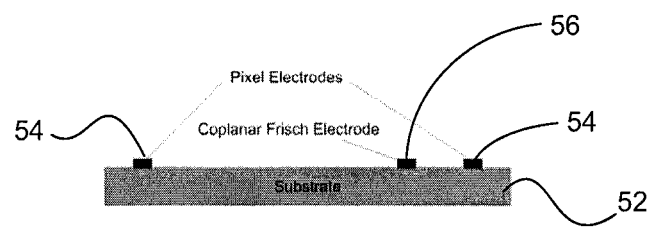
Figure 5D:
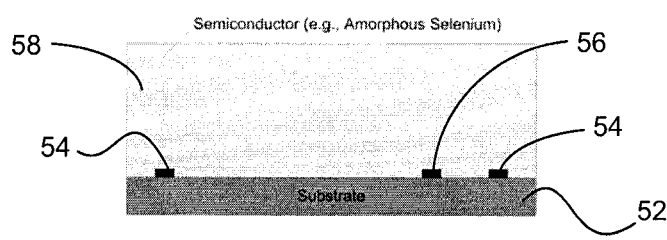

In the manufacture of this embodiment, which can also be termed a lateral radiation detector with a coplanar Frisch grid, there is an initial assumption that there is an existing substrate layer. FIGS. 5b to 5d outline various stages of the manufacture of the lateral radiation detector with coplanar Frisch grid.

On top of the substrate layer, a conductor layer can be deposited using known techniques, such as, but not limited to, sputtering. In the preferred embodiment, the conductor material is a metal such as aluminum or chromium, however other materials having similar characteristics may be contemplated. The set of contacts, or electrodes, and the Frisch grid can then be patterned from the conductor layer using a technique such as photolithography. As can be see, the outer electrodes can be seen as the contacts, or pixel electrodes, such as the anode and the cathode while the interior electrode is the Frisch grid. After the electrodes are patterned, a semiconductor layer can then be deposited over the structure. In one embodiment, the semiconductor material is amorphous selenium which can be deposited via vapor deposition. FIG. 5d shows a lateral metal-semiconductor-metal optical photoconductor with a lateral coplanar Frisch grid. If necessary, for indirect X-ray detection, a phosphor layer can then be either deposited or interfaced with the semiconductor layer. If the detector is to be used in a large area fast optical detector or a digital camera, there is no need for the phosphor layer.

Figure 6A:
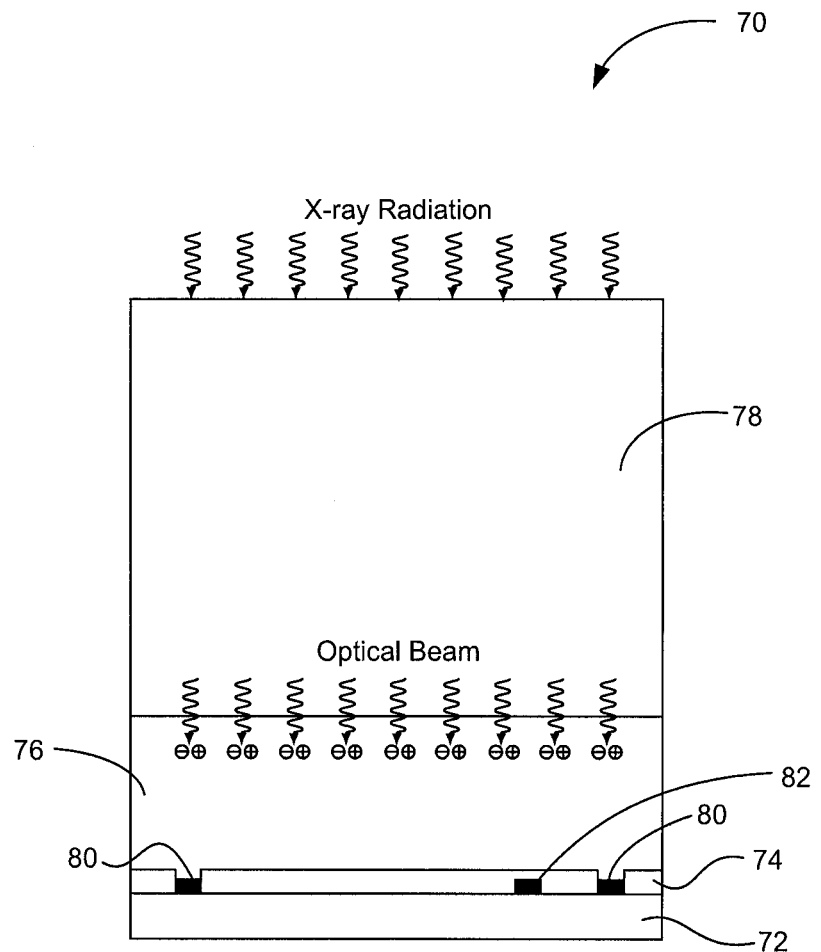
FIG. 6a is a schematic diagram of a lateral radiation detector with an insulated coplanar Frisch grid.
Figure 6B:
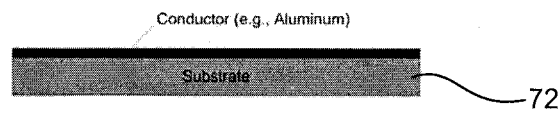
Figure 6C:
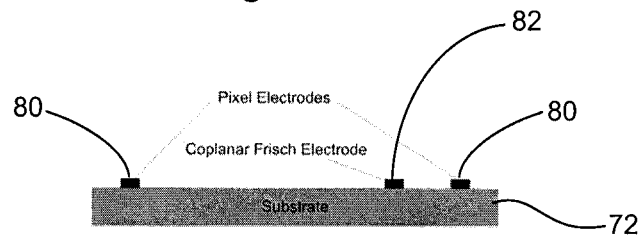
Figure 6D:
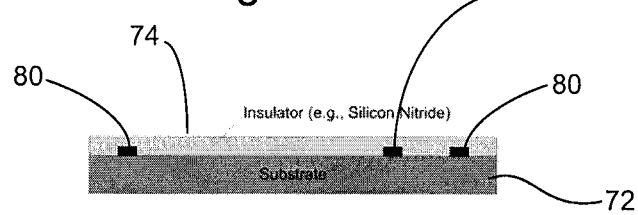
Figure 6E:
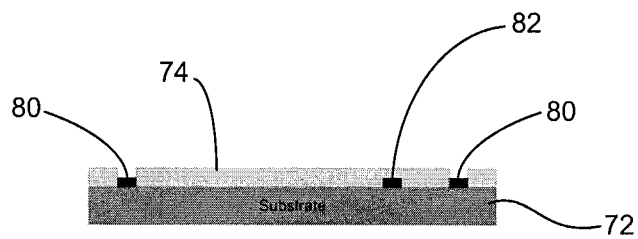
Figure 6F:
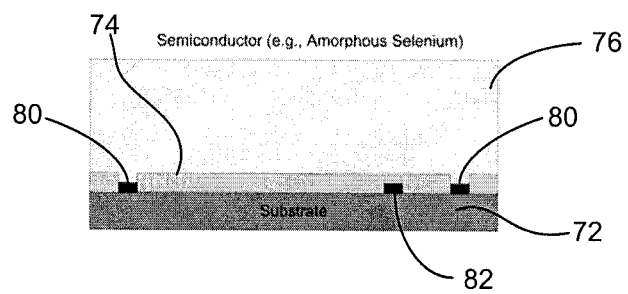

Turning to FIG. 6a, a schematic diagram of a lateral radiation detector with a coplanar isolated Frisch grid is shown. The lateral radiation detector 70 includes a substrate layer 72, an insulator layer 74 a semiconductor layer 76 and a phosphor layer 78. As discussed above, various materials can be selected for each of the layers. Within the insulator layer 74 is a set of contacts, or electrodes 80 along with a Frisch grid 82. As with the embodiment of FIG. 5a, X-ray radiation (represented by arrows 84) travels down through the phosphor layer towards the semiconductor layer which then receives optical beams (seen as arrows 86) having negatively and positively charged carriers. Depending on their charges, the carriers then travel through the semiconductor layer towards their corresponding electrode with the slow-mobility carriers being trapped by the Frisch grid 82. As will be understood, if negatively charged carriers are being collected and analyzed for the image, the Frisch grid is located proximate the anode and if positively charged carriers are being collected, the Frisch grid is located proximate the cathode.

During the manufacturing process, it is assumed that there is an existing substrate layer on which the lateral radiation detector is built. FIGS. 6b to 6f provide schematics of the manufacture of the lateral radiation detector with a coplanar isolated Frisch grid. Similar to the manufacture of the other lateral radiation detectors, a layer of conductive material, such as aluminum, chromium or the like, is deposited on top of the substrate layer via a known technique, such as sputtering. A set of at least three electrodes can then be patterned into the conductive layer using photolithography with the outermost electrodes representing the pixel electrodes and the inner electrode functioning as a Frisch grid. A layer of insulator material can then be deposited over the electrodes on top of the substrate. In one embodiment, the insulator material is Silicon Nitride and the deposition technique may be chemical vapor deposition although other materials and deposition techniques are known.

The layer of insulator material can then be patterned to expose the pixel electrodes. A layer of semiconductor can then be deposited over the structure to complete the lateral radiation detector with an isolated lateral coplanar Frisch grid. As with the embodiment of FIG. 5a, a phosphor layer can also be deposited on or interfaced with the semiconductor layer for indirect x-ray detection.

Figure 7A:
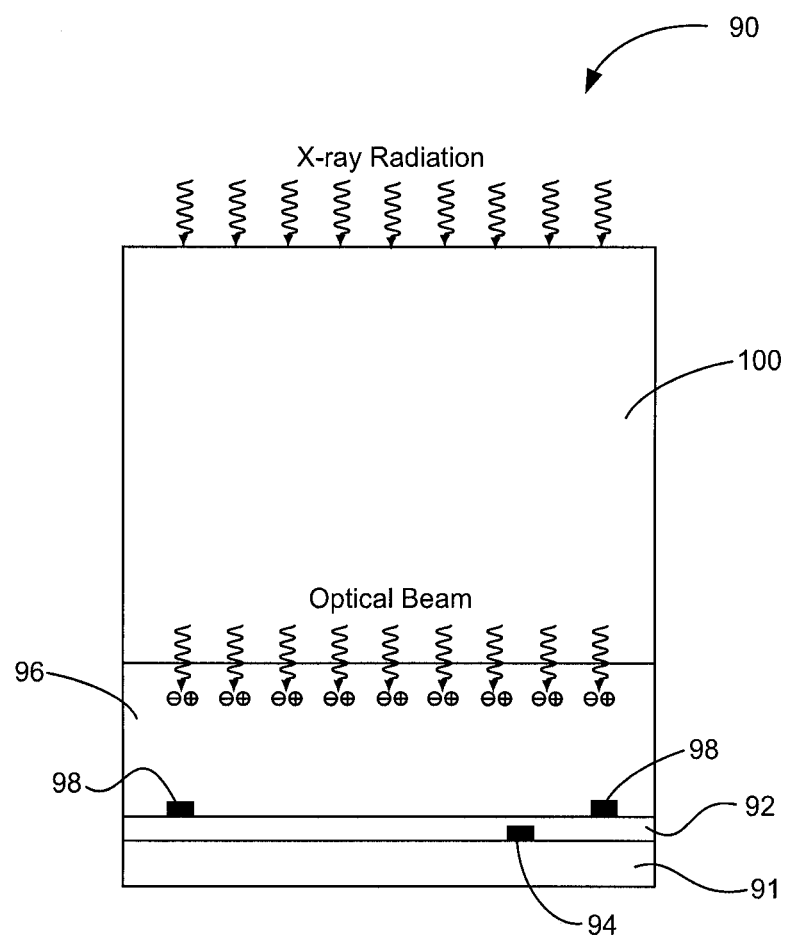
FIG. 7a is a schematic diagram of a lateral radiation detector with a buried Frisch grid.
Figure 7B:
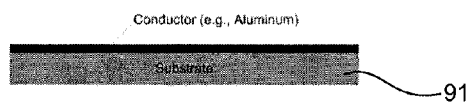
Figure 7C:
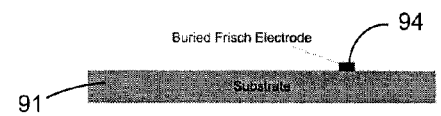
Figure 7D:
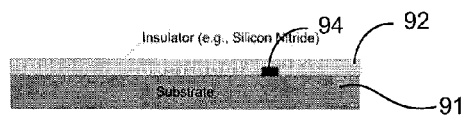
Figure 7E:
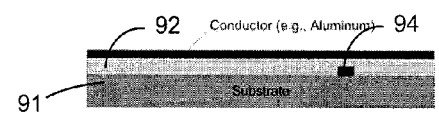
Figure 7F:
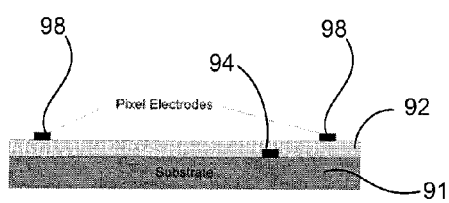
Figure 7G:
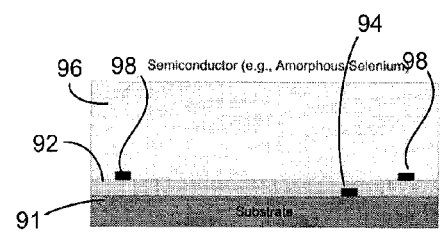

Turning to FIG. 7a, a schematic diagram of yet another embodiment of a lateral radiation detector is shown. In this embodiment, the lateral radiation detector includes a buried Frisch grid. The detector 90 includes substrate layer 91 along with an insulator layer 92 which includes a Frisch grid 94 located within the insulator layer 92. On top of the insulator layer 92 is a semiconductor layer 96 which includes a set of contacts, or electrodes 98, located within. If necessary, phosphor layer 100 is located on top of the semiconductor layer 96.

In the manufacture of this lateral radiation detector with buried Frisch grid, it is assumed that there is an existing substrate layer to build on top of FIGS. 7b to 7g provide diagrams of some stages of the manufacturing process. Initially, a first conductor layer is deposited on top of the substrate layer via known techniques such as sputtering. The Frisch electrode can then be patterned out of the first conductive layer. In this embodiment, the Frisch grid or electrode is isolated from collection electrodes and therefore, does not collect signal charge. After the Frisch electrode has been patterned, an insulator layer is deposited on top of the Frisch electrode and the substrate using chemical vapor deposition in one embodiment. A second conductive layer is then deposited on top of the insulator layer and then patterned to be the contacts, or collection electrodes. The electrode patterning can be performed via photolithography. The semiconductor layer can then be deposited on top of the second conductive layer, thereby enclosing the set of contacts to create the lateral radiation detector with buried Frisch grid. As before, if necessary, the detector can then be interfaced with a phosphor layer for indirect conversion x-ray detection. In this embodiment, the Frisch gird is located underneath the collection electrodes to reduce or prevent the photons from collecting at the Frisch grid.

Figure 8:
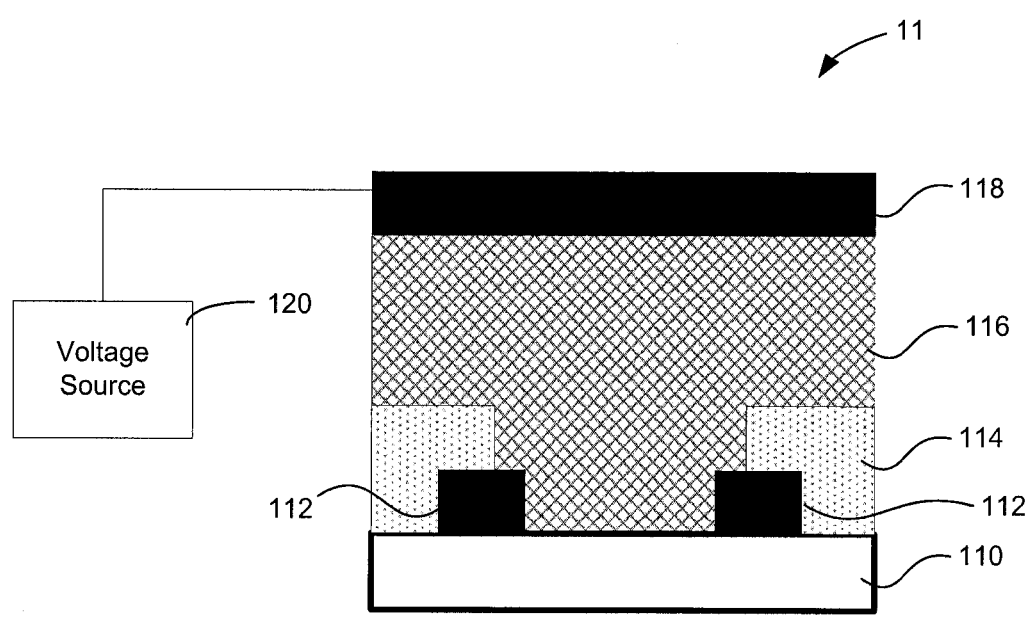
FIG. 8 is a schematic diagram of another embodiment of a lateral radiation detector.
Figure 9A:
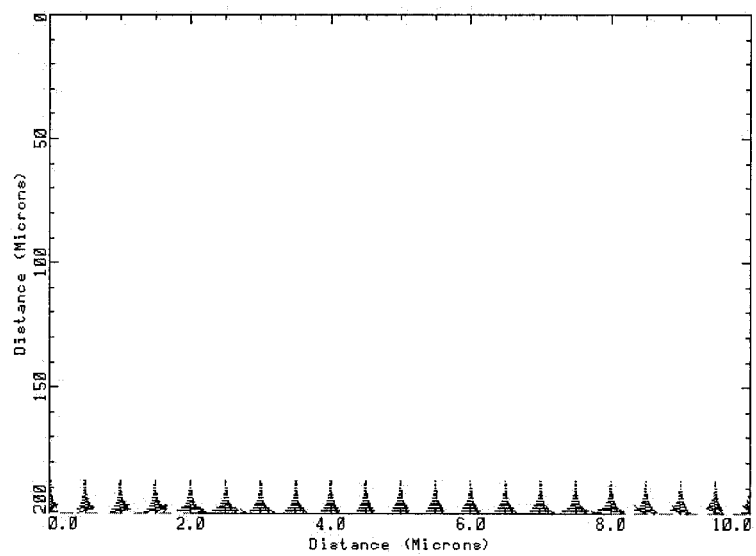
FIGS. 9a and 9b are schematic diagrams relating to the electric field distribution within the lateral detector with and without the top bias voltage applied.
Figure 9B:
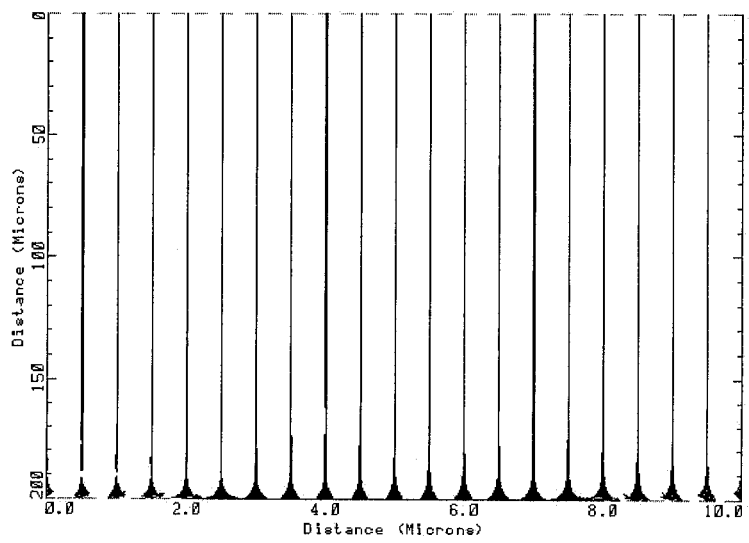

Turning to FIG. 8, yet a further embodiment of a lateral radiation detector is shown. In this embodiment, the radiation detector 11 can be seen as a lateral cascade detector which allows a lateral detector to be used in a direct conversion X-ray detection without the need for a scintillator or a phosphor layer. The radiation detector 11 includes a substrate layer 110 along with a set of contacts, or electrodes 112 which are spaced apart laterally. The radiation detector 11 further includes an insulator layer 114 in contact with the electrodes 112 and a photoconductor layer 116 such as amorphous selenium. Other materials that can be used are Lead Oxide (PbO), Mercury Iodide ($HgI_2$) or Indium Phosphide (InP). A top layer of metal 118, such as aluminum can then be deposited on top of the amorphous selenium layer. The amorphous selenium can be divided into two layers: the carrier cascade layer (top) and carrier drifting layer (bottom). A voltage 120 may also be applied to the cascade carrier layer 118 to improve the carrier separation. FIGS. 9a and 9b provide images relating to the electric field distribution within the lateral detector with and without the top bias voltage applied. FIG. 9a reflects the simulation without the voltage potential applied and FIG. 9b reflects the simulation with the voltage potential applied.

As can be seen, without the voltage potential applied, the carriers generated by the carrier cascade layer 118 require long distance diffusion to reach the contacts while with the voltage potential applied, the carrier travel towards the electrodes in a more efficient manner.

In operation, the amorphous selenium layer is used for X-ray absorption while the carrier cascade layer 118 assists to generate or separate the carriers in the X-rays so that they can travel through the amorphous selenium layer to be collected by the laterally spaced apart electrodes 112.

Figure 10:
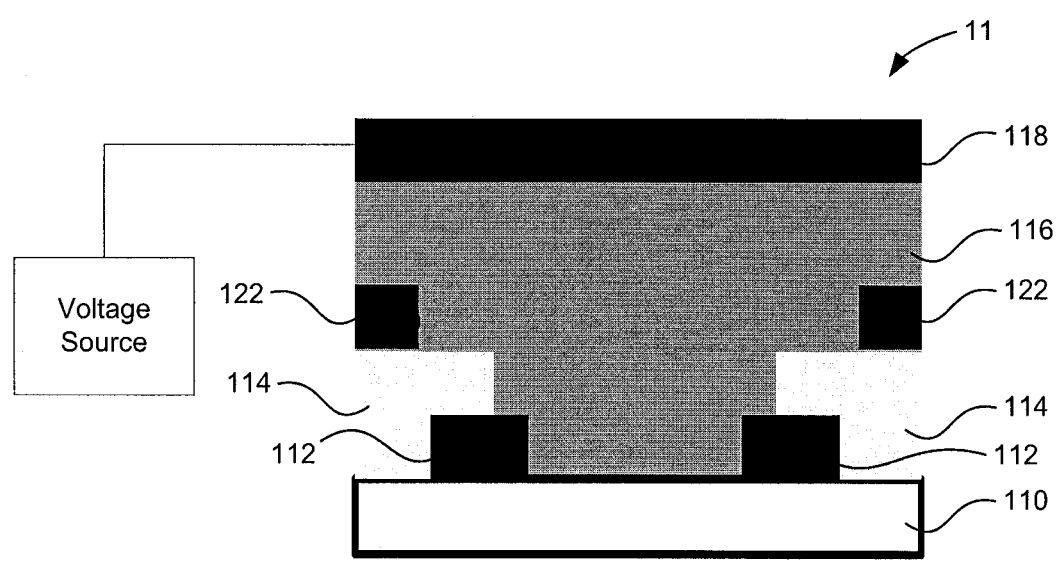
FIG. 10 is a schematic diagram of another embodiment of a lateral radiation detector.

Turning to FIG. 10, yet a further embodiment of a lateral radiation detector is shown. In this embodiment, the radiation detector 11 is similar to the embodiment of FIG. 8. The main difference between the two embodiments is the inclusion of a Frisch grid 122. The Frisch grid 122 may enhance the speed of the detector as it is able to block slower moving carriers from being detected.

Benefits of the lateral radiation detector embodiments of FIGS. 8 and 10 include, but are not limited to, small pixel size capability, fast operation and large area fabrication without blocking the contacts.

Figure 11:
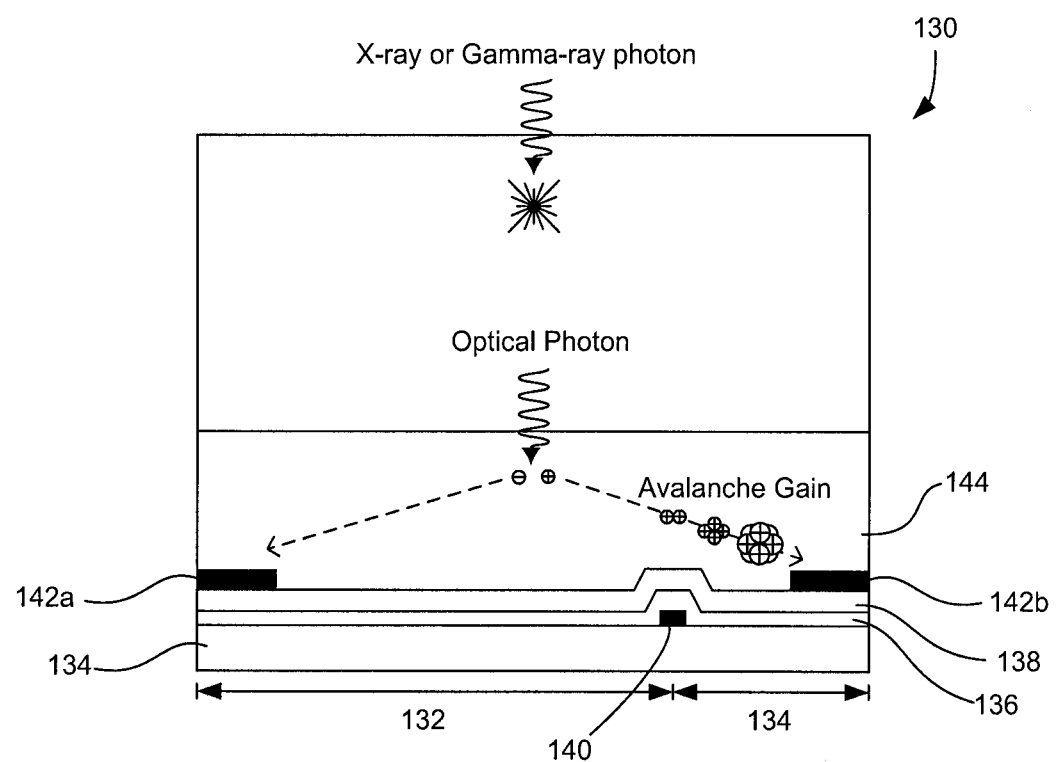
FIG. 11 is a schematic diagram of another embodiment of a lateral radiation detector.

Turning to FIG. 11, another embodiment of a lateral MSM photodetector is shown. More specifically, FIG. 11 relates to a lateral amorphous selenium (a-Se) MSM photodetector is shown. In the preferred embodiment, this photodetector is used for indirect detection of high-energy radiation.

As shown in FIG. 11, a unipolar photodetector 130 is shown having an interaction region 132 where no gain is realized and a detection region 134 where gain is realized. The photodetector 130 includes a substrate layer 134 having a blocking layer 136 located or deposited on top of the substrate layer 134. Deposited atop the blocking layer 136, such as Cerium Oxide, is an insulator layer 138 such as Silicon Nitride. Within the blocking layer 136 is a lateral Frisch grid 140 which is embedded between a set of contacts, one of the contacts presenting a non-collecting electrode 142a and another of the contacts representing a collecting electrode 142b. The set of contacts are located within a semiconductor layer 144 which is deposited on top of the insulator layer 138 during manufacture. A scintillator layer, such as Sodium Iodide, is deposited on top of the semiconductor layer 144.

Use of the lateral Frisch grid reduces the photocurrent lag which can thereby increase the frame rate of the x-ray imager to which the photodetector is connected.

In one embodiment, with a specific biasing conditions high-field detection region for avalanche multiplication gain can be created and therefore the photodetector can be designed as a photomultiplier for higher signal to noise ratio and single phone-counting gamma ray imaging. In the current embodiment shown in FIG. 11, the avalanche region is precisely defined such as etching via photolithography to provide a more stable, reliable and repeatable detector architecture.

Some applications in which the current radiation detector can be used are described below. It will be understood that other applications are contemplated.

For instance, the lateral radiation detector can be used in indirect conversion X-ray imaging. The deployment of new generation chest radiography, mammography, and computed tomography demands extensive research and development on flat-panel imagers (FPI). Currently, the majority of FPIs are based on amorphous silicon technologies and indirect conversion mechanism, where pixel electronics includes photodetectors and switching TFTs. Photodetectors are required particularly for indirect conversion X-ray imaging devices where X-ray is firstly absorbed and converted to optical photons by scintillator materials, then further converted to electrical signals by photodetectors underneath. Therefore, emitting spectra of scintillators or phosphors and sensing wavelengths of these PDs should be matched in order to achieve the best performance. Since those scintillators such as sodium iodide and sodium-doped cesium iodide have much higher emission efficiency in blue (420 nm) than thallium-doped cesium iodide in green (550 nm), imaging devices with the use of blue-sensing photodetectors are expected to yield better performance. However, due to the fact that most photodetectors used in the indirect conversion X-ray imagers are made of amorphous silicon, green-emitting scintillators such as thallium-doped cesium iodide are widely used to compromise the optical absorption of amorphous silicon.

Different from commonly-used PIN photodiodes as PDs in FPIs, a lateral radiation detector with amorphous selenium as the photoconductor layer has a high photoconductive gain (greater than unity) at blue to UV wavelengths and are compatible with more efficient sodium-doped cesium iodide scintillators as discussed previously. The photoconductor has very low dark current, which is especially well-suited for low-level or low-dose X-ray detection.

Another application for the radiation detector is in UV imaging. By taking advantage of strong short-wavelength responsivity of a lateral radiation detector with a-Se as the semiconductor, an improved detector for UV imaging can be designed. UV imagers have been paid a lot of attention in the recent years mostly for biomedical applications such as DNA fragment sizing, DNA sequencing, and amino acid analysis. Since the responsivity is mainly determined by thickness of a-Se layer and channel length. It is believed that there exists an optimum thickness and length for achieving high resposivity at 260 nm as it is the wavelength absorbed significantly by DNA and the low dark current of such MSM PDs provides high signal to noise ratio and sensitivity.

In the preceding description, for purposes of explanation, numerous details are set forth in order to provide a thorough understanding of the embodiments of the disclosure. However, it will be apparent to one skilled in the art that these specific details are not required in order to practice the disclosure.

The above-described embodiments of the disclosure are intended to be examples only. Alterations, modifications and variations can be effected to the particular embodiments by those of skill in the art without departing from the scope of the disclosure, which is defined solely by the claims appended hereto.

What is claimed is:

1. A lateral radiation detector comprising:
    a substrate layer;
    a semiconductor layer;
    an insulator layer located between the semiconductor layer and the substrate layer;
    a Frisch electrode; and
    a set of at least two contacts, wherein the set of at least two contacts includes at least one anode and at least one cathode, the anode and the cathode spaced laterally away from each other and encapsulated by the insulator layer, wherein a portion of the insulator layer is located between the semiconductor layer and the anode or the cathode, and a portion of the semiconductor layer is located between the anode and the cathode completely covering a sidewall of the anode or the cathode; and
    wherein the Frisch electrode is located entirely within the semiconductor layer.

2. The lateral radiation detector of claim 1, wherein the Frisch electrode is located above the at least two contacts.

3. The lateral radiation detector of claim 2, wherein the Frisch electrode is located proximate the anode if negatively charged carriers are being collected.

4. The lateral radiation detector of claim 2, wherein the Frisch electrode is located proximate the cathode if positively charged carriers are being collected.

5. The lateral radiation detector of claim 1, further comprising a layer of phosphor located atop the semiconductor layer.

6. The lateral radiation detector of claim 1, wherein the semiconductor layer is amorphous selenium.

7. The lateral radiation detector of claim 1, further comprising a top electrode layer acting as a cascade carrier layer.

8. The lateral radiation detector of claim 7, wherein the top electrode is located on the semiconductor layer.

* * * * *